United States Patent
Cheng et al.

(10) Patent No.: US 8,392,797 B2
(45) Date of Patent: Mar. 5, 2013

(54) ERROR CORRECTING CONTROLLER, FLASH MEMORY CHIP SYSTEM, AND ERROR CORRECTING METHOD THEREOF

(75) Inventors: Kuo-Yi Cheng, Taipei (TW); Li-Chun Liang, Kaohsiung (TW); Chien-Hua Chu, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 1072 days.

(21) Appl. No.: 12/358,879

(22) Filed: Jan. 23, 2009

(65) Prior Publication Data
US 2010/0125772 A1    May 20, 2010

(30) Foreign Application Priority Data
Nov. 14, 2008 (TW) ............................... 97144160 A (51) Int. Cl.
G11C 29/00 (2006.01)
(52) U.S. Cl. .......................................................... 714/763
(58) Field of Classification Search .................. 714/763, 714/774
See application file for complete search history.

(56) References Cited

U.S. PATENT DOCUMENTS

| | | | | |
|---|---|---|---|---|
| 6,108,730 | A * | 8/2000 | Dell et al. ...................... | 710/301 |
| 6,446,177 | B1 * | 9/2002 | Tanaka et al. .................. | 711/163 |
| 7,747,927 | B2 * | 6/2010 | Guterman et al. ............. | 714/768 |
| 2003/0037299 | A1 * | 2/2003 | Smith ............................ | 714/763 |
| 2003/0177435 | A1 * | 9/2003 | Budd et al. .................... | 714/776 |
| 2005/0034050 | A1 * | 2/2005 | Das et al. ...................... | 714/758 |
| 2006/0212649 | A1 * | 9/2006 | Roberts, Jr. ................... | 711/112 |
| 2007/0074093 | A1 * | 3/2007 | Lasser ........................... | 714/763 |
| 2007/0136639 | A1 * | 6/2007 | Guterman et al. ............. | 714/763 |
| 2008/0163033 | A1 * | 7/2008 | Yim ............................... | 714/785 |
| 2008/0256352 | A1 * | 10/2008 | Chow et al. ................... | 713/2 |
| 2009/0070523 | A1 * | 3/2009 | Kim et al. ..................... | 711/103 |
| 2009/0070651 | A1 * | 3/2009 | Diggs et al. ................... | 714/752 |
| 2009/0070655 | A1 * | 3/2009 | Hsu ............................... | 714/763 |

FOREIGN PATENT DOCUMENTS
CN          101124639 A       2/2008

OTHER PUBLICATIONS
"First Office Action of China Counterpart Application", issued on May 30, 2012, p. 1-p. 3.

* cited by examiner

*Primary Examiner* — Scott Baderman
*Assistant Examiner* — Neil Miles
(74) *Attorney, Agent, or Firm* — J.C. Patents (57) ABSTRACT

An error correcting controller for connecting an old host controller having an old error correcting function with a new flash memory which requires a new error correcting function is provided. When the old host controller needs to write data into the new flash memory, the error correcting controller generates a new error correcting code according to the new error correcting function for the data. Then, when the old host controller needs to read the data from the new flash memory, the error correcting controller performs an error correcting procedure according to the new error correcting code and transmits information to the old host controller according to the result of the error correcting procedure and the old error correcting function. Accordingly, it is possible to allow the old host controller to access the new flash memory without changing the architecture of the old host controller.

13 Claims, 6 Drawing Sheets

ERROR CORRECTING CONTROLLER, FLASH MEMORY CHIP SYSTEM, AND ERROR CORRECTING METHOD THEREOF

CROSS-REFERENCE TO RELATED APPLICATION

This application claims the priority benefit of Taiwan application serial no. 97144160, filed on Nov. 14, 2008. The entirety of the above-mentioned patent application is hereby incorporated by reference herein and made a part of this specification.

BACKGROUND

1. Technology Field

The present invention relates to a flash memory chip system, and more particularly, to a flash memory chip system with an error correcting function and an error correcting controller as well as an error correcting method thereof.

2. Description of Related Art

The rapid growth in the popularity of digital cameras, cellular phones, and MP3 players in recent years has brought about the escalated demand for storage media by consumers. A flash memory has characteristics such as data non-volatility, low power consumption, compact size, and non-mechanical structure and thus is suitable for portable applications, particularly for portable products powered by batteries. For example, a memory card is a storage device using NAND flash memory as a storage medium and is widely adopted as storage media for digital cameras, cellular phones, and MP3 players.

The NAND flash memory has the characteristic that data is written by units of pages and erased by units of blocks. Each memory cell has to be erased before being written in. The blocks may be damaged due to numerous write operations. Therefore, host controllers of hosts (e.g. digital cameras, cellular phones, and MP3 players) using NAND flash memory as storage media must have a block management function capable of managing the flash memory. However, rapid development of the flash memory technology has given rise to flash memory of even greater capacity being pushed to the market. Users of old hosts have demand for storage media of newer and bigger capacity. Generally speaking, a new flash memory requires a stronger block management function to operate, which an old host controller usually may not be able to support, however.

For example, an error correcting procedure is used in the block management function of the flash memory to correct error in the data which is read. Status of a flash memory block (e.g. whether the block is damaged) is obtained according to the results of error correction. Error correcting functions of an old host controller are generally not able to support error correcting capability required by a new generation flash memory. For example, when a host controller is, at manufacture, configured with an error correcting circuit which can detect two error bits and correct 1 error bit, the old host controller will not be able to support a new generation flash memory requiring a controller capable of correcting 4 error bits in order to operate. In view of the foregoing, there exists a demand for developing a mechanism allowing for an old host controller to provide error correcting capability required by a new generation flash memory for accesses thereof without modifying original hardware design structure.

SUMMARY

The present invention provides an error correcting controller enabling a host controller of an old host system to access a new generation flash memory.

The present invention provides a flash memory chip system enabling a host controller of an old host system to access a new generation flash memory.

The present invention provides an error correcting method enabling a host controller of an old host system to access a new generation flash memory.

The present invention provides an error correcting controller including a first flash memory interface, a second flash memory interface, a micro-processor unit, an error creation unit, and a first error correcting unit, wherein the first flash memory interface is for connecting a host controller and the second flash memory interface is for connecting a flash memory. The micro-processor unit is electrically connected to the first flash memory interface and the second flash memory interface and the error creation unit and the first error correcting unit are electrically connected to the micro-processor unit. The first error correcting unit generates a first error correcting code (ECC) when the host controller needs to write data in the flash memory and stores the data to be written and the generated first error correcting code in the flash memory. In the present invention, when the host controller needs to read data from the flash memory, the micro-processor unit reads the data and the first error correcting code corresponding to the data from the flash memory. The first error correcting unit determines whether the read data contains an error bit and if the error bit is correctable according to the read first error correcting code. If the first error correcting unit determines that the read data contains an error bit and the error bit is correctable, the error creation unit generates error data which is correctable and the micro-processor unit transmits the correctable error data to the host controller, wherein the correctable error data is generated according to the data that has been corrected according to the first error correcting code and may be corrected by the host controller. In addition, the present invention also provides a flash memory chip system configured with the abovementioned flash memory and error correcting controller as well as an error correcting method thereof.

The present invention further provides an error correcting controller including a first flash memory interface, a second flash memory interface, a micro-processor unit, and a first error correcting unit, wherein the first flash memory interface is for connecting a host controller and the second flash memory interface is for connecting a flash memory. The micro-processor unit is electrically connected to the first flash memory interface and the second flash memory interface, and the first error correcting unit is electrically connected to the micro-processor unit. The first error correcting unit generates a first error correcting code when the host controller needs to write data into the flash memory and stores the data to be written and the generated first error correcting code in the flash memory. When the host controller needs to read data from the flash memory, the micro-processor reads the data and the corresponding first error correcting code from the flash memory. The first error correcting unit performs an error correcting procedure on the read data that is read according to the first error correcting code. The micro-processor unit transmits the error corrected data to the host controller, wherein the micro-processor unit responds to the host controller with a number of error bits determined during the error correcting procedure according to a vendor command.

In addition, the present invention also provides a flash memory chip system configured with the abovementioned flash memory and error correcting controller as well as an error correcting method thereof.

Based on the above, the present invention enables a host controller of an old system to access a new generation flash memory by configuring an error correcting controller capable of supporting a new flash memory between the host controller of the old system and the new flash memory and through execution of error correcting coding and an error correcting procedure consistent with the new flash memory requirements by the error correcting controller.

In order to make the aforementioned and other objects, features and advantages of the present invention more comprehensible, exemplarily embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplarily embodiments of the invention and, together with the description, serve to explain the principles of the invention.

DESCRIPTION OF EXEMPLARILY EMBODIMENTS

The present invention performs error correcting coding and an error correcting procedure on accessed data by configuring an error correcting controller capable of supporting a new flash memory between a host controller of an old host system and the new flash memory. Hence, the host controller of the old host system can access the new generation flash memory without modifying structure of the old host system. Several exemplary exemplarily embodiments are described below to illustrate the present invention in detail.

First Exemplarily Embodiment

Figure 1:
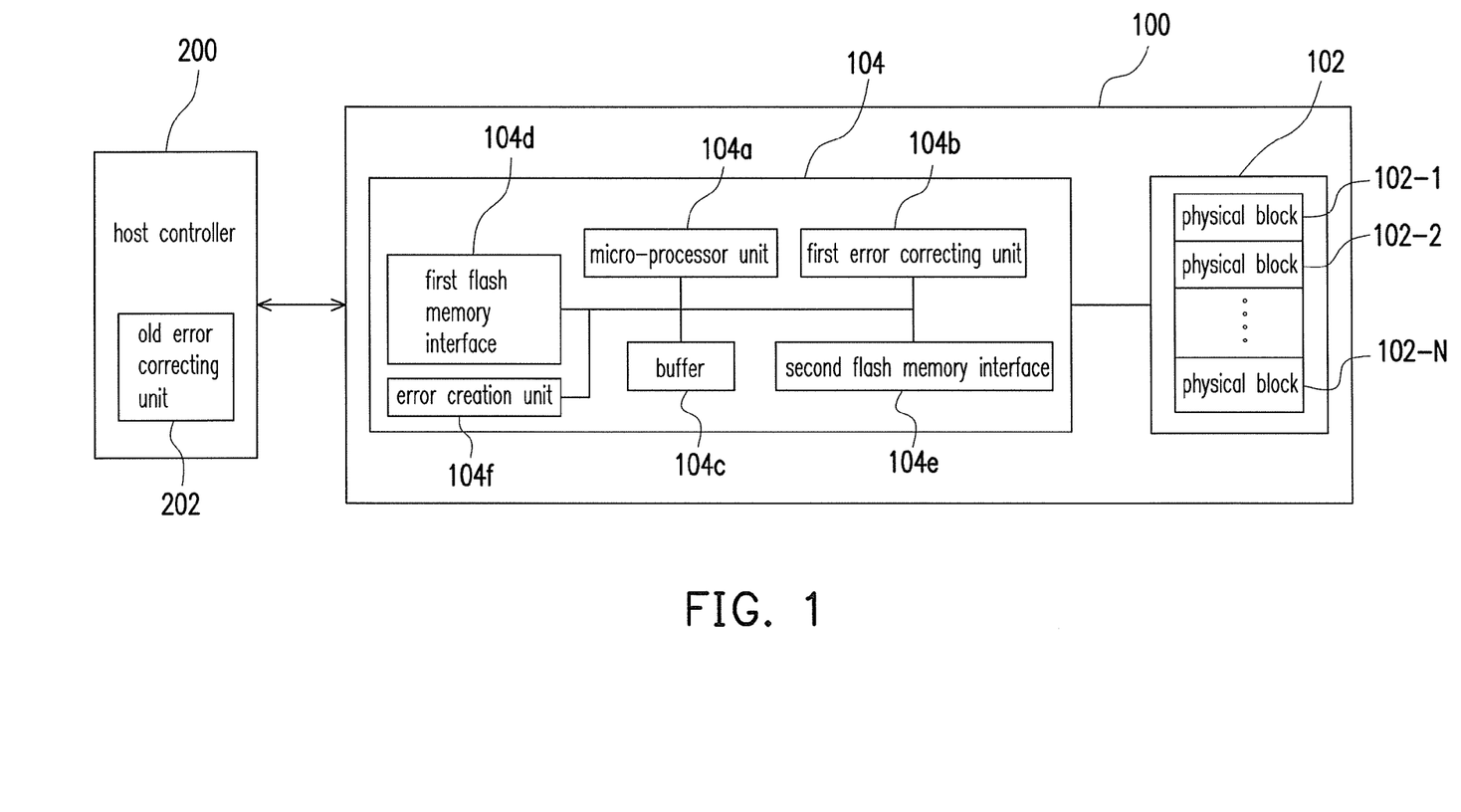
FIG. 1 is a schematic block diagram illustrating a flash memory chip system according to a first exemplarily embodiment of the present invention.

FIG. 1 is a schematic block diagram illustrating a flash memory chip system according to a first exemplarily embodiment of the present invention.

Referring to FIG. 1, a flash memory chip system 100 includes a flash memory 102 and an error correcting controller 104. The flash memory chip system 100 is connected to a host controller 200 which performs various access operations thereon. Particularly, the host controller 200 has an old error correcting unit 202 capable of providing error correction of 1 error bit and error detection of two error bits. It should be noted that the flash memory 102 and the error correcting controller 104 of the present exemplarily embodiment are packaged as a single system on chip (SoC). In another exemplarily embodiment of the present invention, however, the flash memory 102 and the error correcting controller 104 may be individual chips.

The flash memory 102 is a storage medium for storing data. The flash memory 102 is divided into a plurality of physical blocks 102-1~102-N. The physical block units are defined as data area and spare area. The physical blocks classified as the data area store valid data written by write commands while physical blocks in the spare area are for alternating the physical blocks in the data area when the write commands are executed. Specifically, when the host controller 200 needs to write into the physical blocks in the data area, the host controller 200 selects the physical blocks from the spare area and writes valid old data in the physical blocks in the data area and the new data to be written into the physical blocks selected from the spare area, associates the physical blocks written with the new data as data area, and erases as well as associates the original physical blocks in the data area as spare area. In order for the host system to which the host controller 200 belongs to smoothly access the physical blocks storing data in the alternate manner, the host controller 200 is configured with logical blocks for the host system to access, wherein the logical blocks are configured according to size of the physical blocks. In other words, the host controller 200 establishes a logical-physical address mapping table in which a mapping relationship between the logical blocks and the physical blocks in the data area is recorded and updated to reflect alternation of the physical blocks. Therefore, the host system only needs to send commands directed at the logical blocks to the host controller 200 which in fact performs the reading and writing according to the logical-physical address mapping table. In addition, a portion of the physical blocks in the flash memory 102 is retained as a replacement area which is for replacing damaged physical blocks in the data area or spare area so that operations can be carried on.

The error correcting controller 104 is electrically connected to the flash memory 102 and is for performing an error correcting coding and an error correcting procedure required by the flash memory 102. For example, the error correcting coding and the error correcting procedure capable of error correction of 4 error bits is provided when performing access to the flash memory 102. In general, the error correcting procedure includes determining whether data has an error bit according to a pre-stored error correcting code and correcting the error bit according to the error correcting code when the data has the error bit. In particular, in the present exemplarily embodiment, the error correcting controller 104 transmits data which may be processed by the error correcting unit 202 to the host controller 200 after performing the error correcting procedure on the data to be read by the host controller.

The error correcting controller 104 includes a micro-processor unit 104a, a first error correcting unit 104b, a buffer 104c, a first flash memory interface 104d, a second flash memory interface 104e, and an error creation unit 104f.

Figure 3:
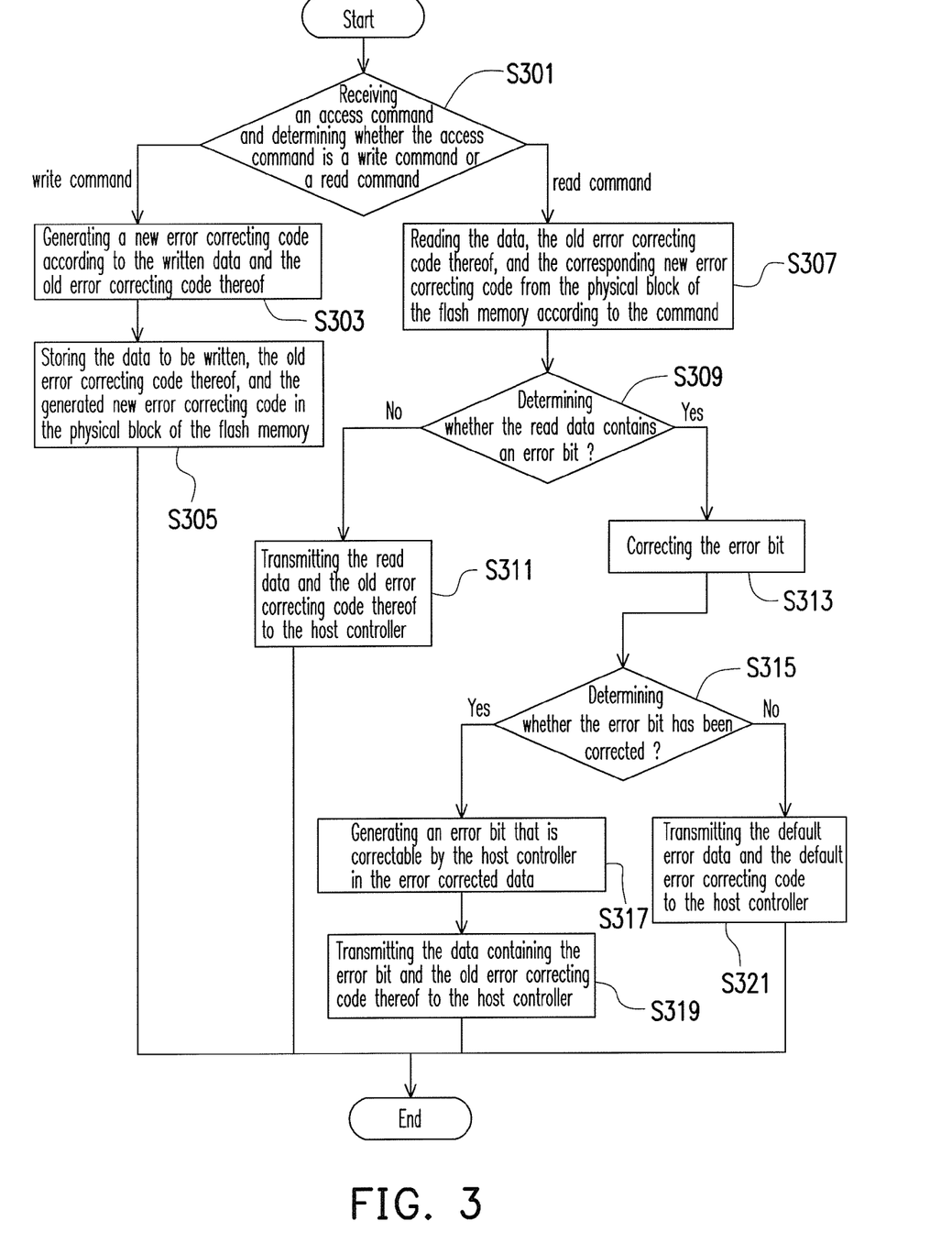
FIG. 3 is a flowchart illustrating steps of error correction according to the first exemplarily embodiment of the present invention.

The micro-processor unit 104a is configured for controlling and coordinating operations of all components in the error correcting controller 104. Specifically, the micro-processor unit 104a processes and responds to the access commands (e.g. write or read commands) issued by the host controller 200 to the flash memory chip system 100 according to the error correcting method of the present exemplarily embodiment (as shown in FIG. 3).

The first error correcting unit 104b is electrically connected to the micro-processor unit 104a. The first error correcting unit 104b generates a new error correcting code complying with specification of the flash memory 102 when the host controller 200 needs to write data into the flash memory chip system 100.

In the present exemplarily embodiment, a maximum number of error correcting bits of the first error correcting unit 104b is designed to be 4 bits and the first error correcting unit 104b is capable of detecting 8 error bits to provide the error correcting capability required by the flash memory system 102. However, it should be noted that the first error correcting unit 104b of the present invention is not limited to an error correcting circuit designed to have the maximum number of error correcting bits of 4. In other words, any error correcting circuit capable of supporting the error correcting capability required by the flash memory 102 may be adopted in the present invention. For example, if the flash memory 102 needs to use error correcting coding and error correcting procedure capable of error correcting 4 error bits to perform access, the first correcting unit 104b may have an error correcting circuit capable of correcting 4 error bits, 8 error bits, 12 error bits, 24 error bits, or 48 error bits.

The buffer 104c is electrically connected to the micro-processor unit 104a and is for temporarily storing data transmitted between the host controller 200 and the flash memory 102.

The first flash memory interface 104d is configured for connecting with the host controller 200 and the second flash memory interface 104e is configured for connecting with the flash memory 102.

The error creation unit 104f is electrically connected to the micro-processor unit 104a and generates an error bit in the data according to commands of the micro-processor unit 104a. It should be mentioned that a hardware structure is used in the present exemplarily embodiment to implement the error creation unit 104f. The present invention is not limited thereto, however. The error creation unit 10f may be implemented in a form of firmware. In another exemplarily embodiment, the error correcting unit 104f may also be implemented in a micro-processor unit 104a.

Figure 2:
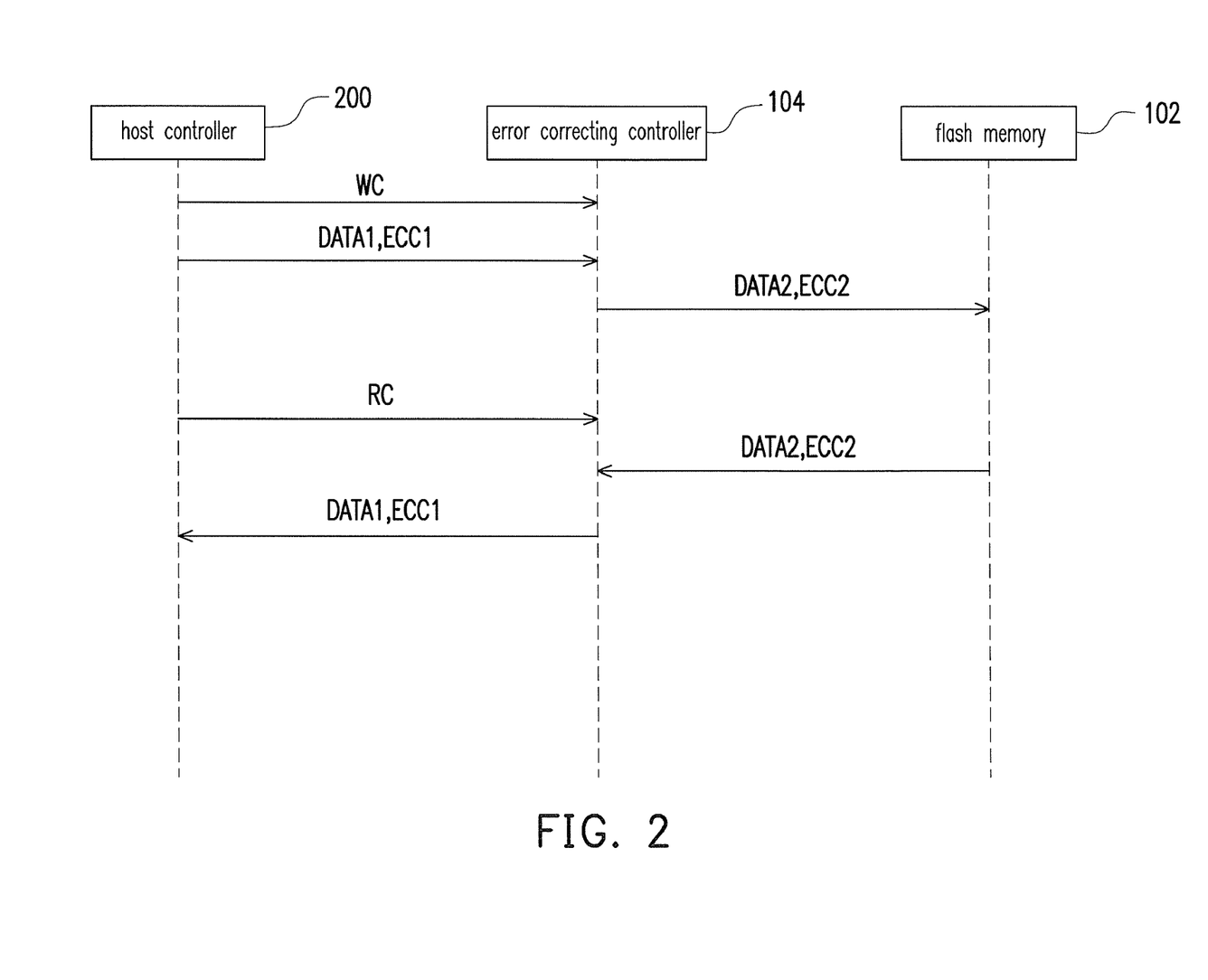
FIG. 2 is a schematic diagram illustrating data flow of a host controller accessing the flash memory chip system according to the first exemplarily embodiment of the present invention.

FIG. 2 is a schematic diagram illustrating data flow of a host controller 200 accessing the flash memory chip system 100 according to the first exemplarily embodiment of the present invention.

Referring to FIG. 2, when the host controller 200 receives from the host system (not shown) data DATA1 to be written, an old error correcting unit 202 of the host controller 200 generates an old error correcting code ECC1 according to the data DATA1, and the host controller 200 sends write commands to the flash memory chip system 100 and also transmits the data DATA1 and the old error correcting code ECC1 to the flash memory chip system 100.

When the micro-processor unit 104a of the error correcting controller 104 receives a write command WC, the data DATA1, and the old error correcting code ECC1 sent by the host controller 200 through the first flash memory interface 104d, the micro-processor unit 104a acknowledges that the access command is a write command and temporarily stores the data DATA1 and the old error correcting code ECC1 in the buffer 104c. Then, the first error correcting unit 104b uses data DATA2 including the data DATA1 and the old error correcting code ECC1 to generate a new error correcting code ECC2. Finally, the data DATA2 and the new error correcting code ECC2 are written to physical blocks of the flash memory 102.

In addition, when the micro-processor unit 104a of the error correcting controller 104 receives from the host controller 200 a read command RC for reading the data DATA1 and the old error correcting code ECC1 through the first flash memory interface 104d, the micro-processor unit 104a reads from the flash memory 102 the data DATA2 including the data DATA1 and the old error correcting code ECC1 as well as the new error correcting code ECC2 and temporarily stores the data DATA2 and the new error correcting code ECC2 in the buffer 104c. Afterward, the first error correcting unit 104b performs the error correcting procedure on the read data DATA2 according to the error correcting code ECC2. Then, the micro-processor unit 104a transmits corresponding data to the host controller 200 according to the error correcting results.

Specifically, the first error correcting unit 104b performs the error correcting procedure to determine whether the data DATA2 has an error bit and attempts to perform error correction on the error bit if the data DATA2 has an error bit. It should be noted that because the old error correcting unit 202 of the host controller 200 also performs the error correcting procedure and the host controller 200 performs relevant management operations (e.g. performing a wear-leveling procedure) on blocks of the flash memory according to the execution results of the old error correcting unit 202. Therefore, the micro-processor unit 104a of the present exemplarily embodiment provides the data DATA1 and the old error correcting code ECC1 to the host controller 200 according to the error correcting capability of the old error correcting unit 202 after the first error correcting unit 104b completes the error correcting procedure on the data DATA2.

For example, when the first error correcting unit 104b determines that the data DATA2 does not contain an error bit, the micro-processor unit 104a transmits the read data DATA1 and the old error correcting code ECC1 to the host controller 200.

In addition, when the first error correcting unit 104b determines that the data DATA2 contains an error bit and the error bit is correctable, the error creation unit 104f randomly generates an error bit in the error corrected data DATA1 received from the first error correcting unit 104b and the micro-processor unit 104a transmits the error corrected data DATA1 having the error bit and the old error correcting code ECC1 to the host controller 200. In particular, the transmitted data DATA1 having the error bit and generated by the error creation unit 104f can be error corrected by the old error correcting unit 202 according to the old error correcting code ECC1. Therefore, the error creation unit 104f generates the error bit in the data DATA1 according to the error correcting capability of the old error correcting unit 202. In the present exemplarily embodiment, the old error correcting unit 202 is capable of correcting 1 error bit so the error creation unit 104f randomly generates 1 error bit in the data DATA1 and the micro-processor unit 104a transmits the data DATA1 containing the 1 error bit and the old error correcting code ECC1 to the host controller 200. Based on the above description of the present exemplarily embodiment, the error correcting controller 104 of the flash memory chip system 100 not only has corrected the error bit but may also provide information regarding occurrence of an error bit to the host controller 200, which then can acknowledge the situation of unstable storage status in the physical block to be accessed.

It should be noted that in another exemplarily embodiment of the present invention, in the case when the old error correcting unit 202 is capable of correcting 4 error bits and the first error correcting unit 104b is capable of correcting 8 error bits, the error creation unit 104f may also generate the data DATA1 containing error bits according to a mapping rule. For example, when the data DATA2 has 1 or 2 error bits, the error creation unit 104f creates 1 error bit in the data DATA1 already corrected by the first error correcting unit 104b; when the data DATA2 has 3 or 4 error bits, the error creation unit 104f creates 2 error bits in the data DATA1 already corrected by the first error correcting unit 104b; when the data DATA2 has 5 or 6 error bits, the error creation unit 104f creates 3 error bits in the data DATA1 already corrected by the first error correcting unit 104b; when the data DATA2 has 7 or 8 error bits, the error creation unit 104f creates 4 error bits in the data DATA1 already corrected by the first error correcting unit 104b.

Furthermore, when the first error correcting unit 104b determines that the data DATA2 contains an error bit and the error bit is not correctable, the micro-processor unit 104a transmits default error data and default error correcting code that are pre-stored to the host controller 200. For example, the default error data may be determined as an uncorrectable error bit by the old error correcting unit 202 according to the default error correcting code.

Specifically, the first error correcting unit 104b has determined that the data DATA2 is not correctable (i.e. the data DATA2 has 5~8 error bits). That is, the data DATA1 in the flash memory 102 has been lost. Therefore, the micro-processor unit 104a has to inform the old error correcting unit 202 that the data DATA1 has been lost so that the host controller 200 may determine that the physical block storing the data DATA1 has been damaged according to the error correcting result of the old error correcting unit 202. In the present exemplarily embodiment, the old error correcting unit 202 can perform the error correcting coding and error correcting procedure capable of detecting 2 error bits and correcting 1 error bit so the default error data pre-stored by the micro-processor unit 104a has 2 error bits. It should be noted that the abovementioned mapping rule is for the purpose of illustration and is not needed to limit the scope of the present invention.

In another exemplarily embodiment, in addition to the mapping rule, the host controller 200 may issue a vendor command during the period of reading data. By means of the vendor command, the host controller 200 may read an actual number of error bits of the data DATA1 from the flash memory chip system 100 so as to carry out corresponding management mechanism directed at the actual damage conditions of the flash memory 102. In other words, the error correcting controller 104 transmits the error corrected data DATA1 to the host controller 200 and additionally sends the actual number of error bits to the host controller 200 in response to the vendor command.

In addition, it should be noted that the physical blocks of the flash memory 102 of the present exemplarily embodiment store relevant parameter information used by the error correcting controller 104 (e.g. information regarding the error correcting capability required by the physical blocks of the flash memory 102, information regarding the error correcting capability of the host controller 200, firmware programs of the error correcting controller 104, etc.). However, to prevent the possibility of the host controller 200 mistakenly deleting data stored in the physical block due to inability to identify the physical block storing the important information, the micro-processor unit 104a marks the physical block storing the information as a damaged physical block in the present exemplarily embodiment. Therefore, when accessing the physical blocks, the host controller 110 identifies the physical blocks as damaged physical blocks according to the mark and uses physical blocks in the abovementioned replacement area to perform accesses.

Based on the above, the flash memory chip system 100 in the exemplarily embodiment of the present invention may be provided for accesses by the host controller of the old host system, thereby resolving the problem that the host controller of the old host system can not support the new flash memory. The error correcting method of the present invention is illustrated below with reference to FIG. 3.

FIG. 3 is a flowchart illustrating steps of error correction according to the first exemplarily embodiment of the present invention.

Referring to FIG. 3, in step S301, an access command is received from the host controller 200 and is determined as a write command or a read command.

If the access command is a write command, in step S303, a new error correcting code (e.g. the new error correcting code ECC2) is generated according to the written data and the old error correcting code thereof (e.g. the data DATA1 and the old error correcting code ECC1). In step S305, the data to be written, the old error correcting code thereof, and the generated new error correcting code are stored in the physical block of the flash memory 102.

If the access command is a read command, in step S307, the data, the old error correcting code thereof (e.g. the data DATA1 and the old error correcting code ECC1), and the corresponding new error correcting code are read from the physical block of the flash memory 102 according to the command.

Then, in step S309, a determination is made on whether an error bit has occurred in the read data and the old error correcting code thereof according to the new error correcting code. If it is determined in step S309 that the read data and the old error correcting code thereof do not contain an error bit, then in step S311, the read data and the old error correcting code thereof are transmitted to the host controller 200.

If it is determined that the read data and the old error correcting code thereof contain an error bit, an error correcting procedure is performed on the error bit in step S313 and a determination is made on whether the error bit has been corrected in step S315. If the result of the error correcting procedure in step S315 shows that the error has been corrected, in step S317, an error bit correctable by the host controller 200 is generated in the error corrected data and in step S319, the data containing the error bit and the old error correcting code thereof are transmitted to the host controller 200.

If it is determined in step S315 that the error bit is not correctable, in step S321, default error data and default error correcting code are transmitted to the host controller 200.

In addition, as described above, to prevent the host controller 200 from mistakenly deleting setting information of the error correcting controller 104, in another exemplarily embodiment of the present invention, the aforesaid error correcting steps further include storing parameter information related to the first error correcting unit in a physical block of the flash memory and marking the physical block as a damaged block.

It should be noted that to prevent occurrence of an error bit when programming the flash memory, the error correcting controller 104 further includes a data converter (not shown). When the error correcting controller 104 receives from the host controller 200 the data DATA1 to be written into the flash memory 102, the data converter performs appropriate conversion on each bit of the data DATA1 to distribute or rearrange the bits in the data DATA1 which are continuous and having same value (e.g. multiple continuous bits of value 0 or multiple continuous bits of value 1) so that the programming of the flash memory 102 is more stable. In particular, the data converter determines if the data DATA1 contains continuous bits of same value. Only if the data DATA1 has continuous bits of same value does the data converter perform the aforementioned conversion on the data DATA1.

Second Exemplarily Embodiment

Figure 4:
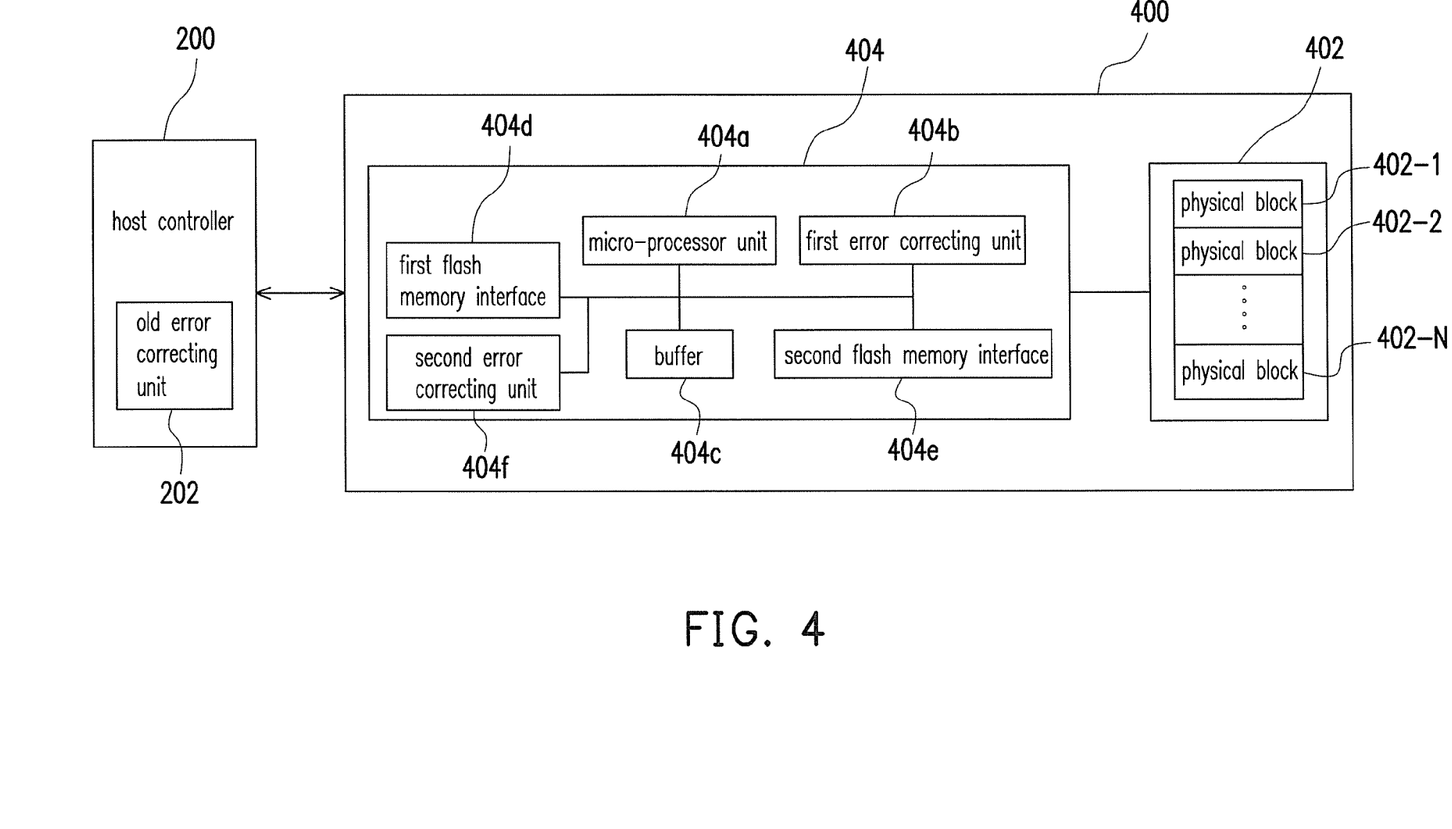
FIG. 4 is a schematic block diagram illustrating a flash memory chip system according to a second exemplarily embodiment of the present invention.

FIG. 4 is a schematic block diagram illustrating a flash memory chip system according to a second exemplarily embodiment of the present invention.

Referring to FIG. 4, a flash memory chip system 400 includes a flash memory 402 and an error correcting controller 404. The flash memory chip system 400 is connected to a host controller 200 which performs various access operations thereon. As described above, the host controller 200 has an old error correcting unit 202 capable of providing error correction of 1 error bit and error detection of two error bits.

The flash memory 402 is the same as the flash memory 102 in the first exemplarily embodiment, which is not repetitively illustrated herein.

The error correcting controller 404 is electrically connected to the flash memory 402 and is configured for performing an error correcting coding and an error correcting procedure required by the flash memory 402. The error correcting controller 404 includes a micro-processor unit 404a, a first error correcting unit 404b, a buffer 404c, a first flash memory interface 404d, a second flash memory interface 404e, and a second error correcting unit 404f.

The second error correcting unit 404f is electrically connected to the micro-processor unit 404a and has an error correcting circuit of the same error correcting capability as the old error correcting unit 202. For example, the second error correcting unit 404f is capable of performing error correction of 1 error bit and error detection of two error bits on data. Furthermore, the micro-processor unit 404a, the first error correcting unit 404b, the buffer 404c, the first flash memory interface 404d, and the second flash memory interface 404e have substantially the same functionality and structure as the micro-processor unit 104a, the first error correcting unit 104b, the buffer 104c, the first flash memory interface 104d, and the second flash memory interface 104e of the first exemplarily embodiment with differences as described in the following.

Figure 5:
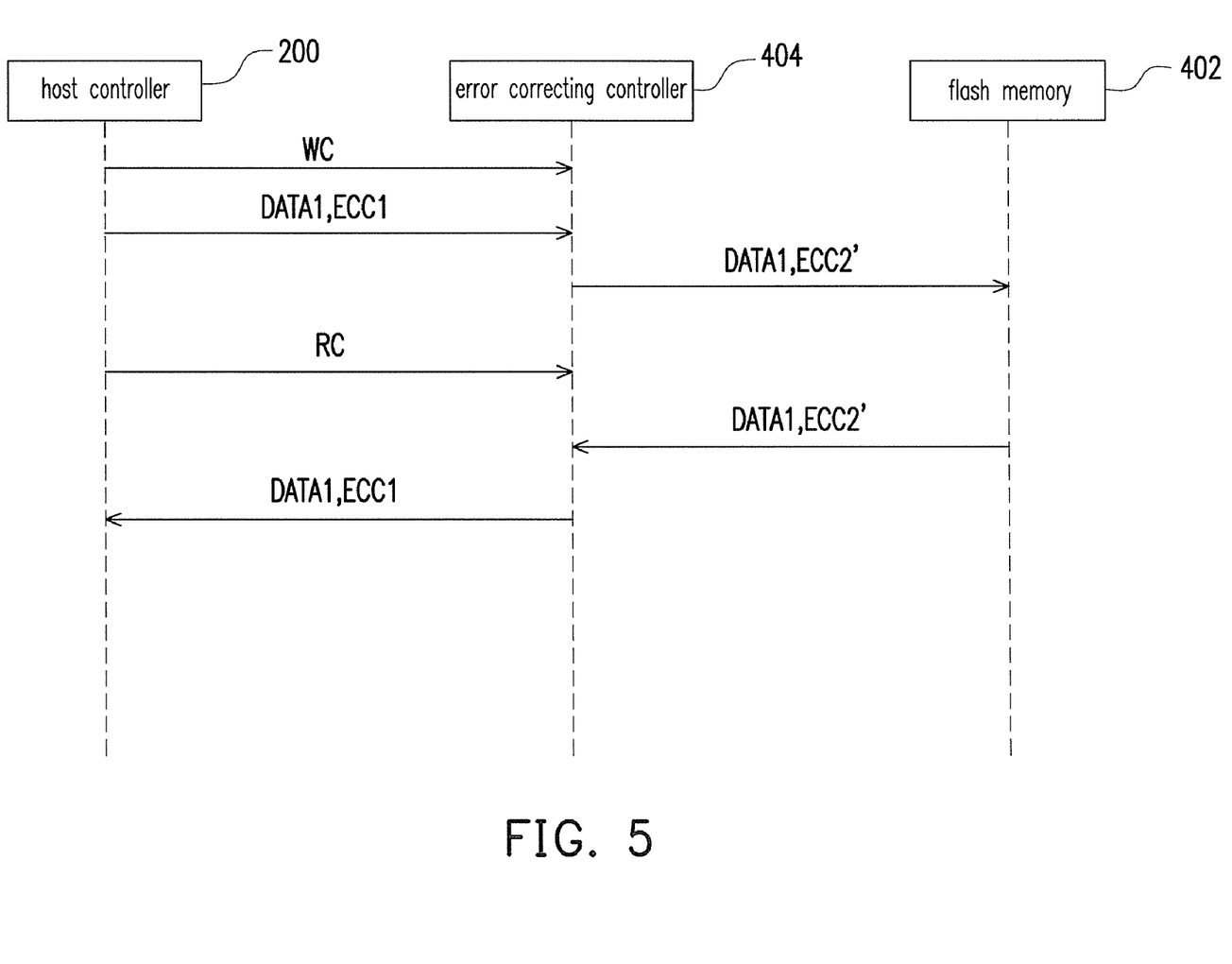
FIG. 5 is a schematic diagram illustrating data flow of a host controller accessing the flash memory chip system according to the second exemplarily embodiment of the present invention.

FIG. 5 is a schematic diagram illustrating data flow of a host controller 200 accessing the flash memory chip system 400 according to the second exemplarily embodiment of the present invention.

Referring to FIG. 5, when the host controller 200 receives from the host system data DATA1 to be written, an old error correcting unit 202 of the host controller 200 generates an old error correcting code ECC1 according to the data DATA1. The host controller 200 sends commands to the flash memory chip system 400 and also transmits the data DATA1 and the old error correcting code ECC1 to the flash memory chip system 400.

When the micro-processor unit 404a of the error correcting controller 404 receives a write command, the data DATA1, and the old error correcting code ECC1 sent by the host controller 200 through the first flash memory interface 404d, the micro-processor unit 404a acknowledges that the access command is a write command and temporarily stores the data DATA1 and the old error correcting code ECC1 in the buffer 404c.

In the present exemplarily embodiment, the second error correcting unit 404f performs the error correcting procedure on the data DATA1 according to the old error correcting code ECC1. After programming, the host controller 200 issues a vendor command. At this time, if the data DATA1 can not be corrected by the second error correcting unit such that the write operation can not be completed, the micro-processor unit 404a responds to the host controller 200 that the data DATA1 can not be written and the host controller 200 then performs programming once again. By means of the above, the written data may also be accurately written and corrected. Afterwards, the first error correcting unit 404b generates a new error correcting code ECC2' according to the data DATA1. Finally, the data DATA1 and the new error correcting code ECC2' are transmitted to physical blocks of the flash memory 402.

Moreover, when the host controller 200 needs to read the data DATA1 and the old error correcting code ECC1 from the flash memory chip system 400, the micro-processor unit 404a reads the data DATA1 and the new error correcting code ECC2' from the flash memory 402 according to the read command from the host controller 200 and temporarily stores the data DATA1 and the new error correcting code ECC2' in the buffer 404c. Afterward, the first error correcting unit 404b performs the error correcting procedure on the read data DATA1 according to the new error correcting code ECC2'. Then, the micro-processor unit 404a transmits corresponding data to the host controller 200 according to the error correcting results.

Specifically, the first error correcting unit 404b performs the error correcting procedure to determine whether the data DATA1 has an error bit and attempts to perform error correction on the error bit if the data DATA1 has an error bit.

When the first error correcting unit 404b determines that the read data DATA1 does not contains an error bit, the second error correcting unit 404f re-generates the old error correcting code ECC1 and the micro-processor unit 404a transmits the read data DATA1 and the re-generated old error correcting code ECC1 to the host controller 200. The error correcting controller 400 of the present exemplarily embodiment does not store the old error correcting code ECC1 and therefore re-generates the old error correcting code ECC1 by means of the second error correcting unit 404f.

In addition, when the first error correcting unit 404b determines that the data DATA1 contains an error bit and the error bit is correctable, the micro-processor unit 404a randomly generates an error bit in the error corrected data DATA1 received from the first error correcting unit 404b and transmits the error corrected data DATA1 having the error bit and the old error correcting code ECC1 to the host controller 200. The same as the first exemplarily embodiment, the error corrected data DATA1 having an error bit and generated by the micro-processor unit 404a has to be error corrected by the old error correcting unit 202 according to the old error correcting code ECC1. Therefore, the micro-processor unit 404a generates an error bit in the data DATA1 according to the error correcting capability of the old error correcting unit 202. Similarly, in this exemplarily embodiment, the error correcting controller 400 re-generates the old error correcting code ECC1 according to the error corrected data DATA1 through the second error correcting unit 404f.

Furthermore, when the first error correcting unit 404b determines that the data DATA1 contains an error bit and the error bit is not correctable, the micro-processor unit 404a transmits default error data and default error correcting code that are pre-stored to the host controller 200. As described in the first exemplarily embodiment, the default error data may be determined as an uncorrectable error bit by the old error correcting unit 202 according to the default error correcting code.

In the first exemplarily embodiment, as shown in FIG. 2, the error correcting controller performs error correcting coding on the data containing the original data and the old error correcting code and stores the original data, the old error correcting code, as well as the new error correcting code in the flash memory. Thus, more storage space is required to store both the old error correcting code and the new error correcting code. However, the flash memory chip system 400 provided in the second exemplarily embodiment not only achieves the functionality of the first exemplarily embodiment but also saves the space of the flash memory required to store data. The error correcting method of the present exemplarily embodiment is illustrated below with reference to FIG. 6.

Figure 6:
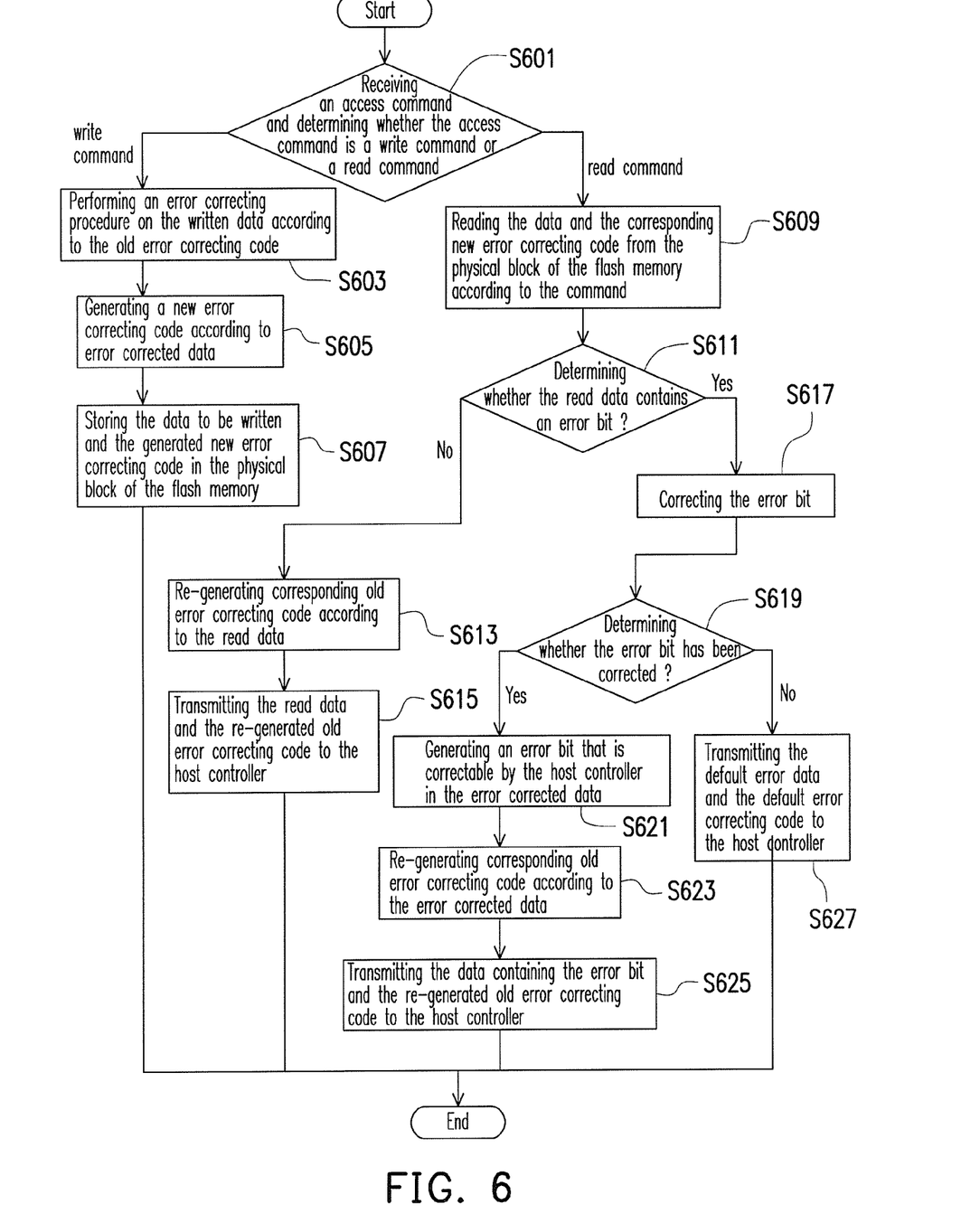
FIG. 6 is a flowchart illustrating steps of error correction according to the second exemplarily embodiment of the present invention.

FIG. 6 is a flowchart illustrating steps of error correction according to the second exemplarily embodiment of the present invention.

Referring to FIG. 6, in step S601, an access command is received from the host controller 200 and is determined as a write command or a read command.

If the access command is a write command, in step S603, an error correcting procedure is performed on the written data (e.g. the data DATA1) according to the old error correcting code (e.g. the old error correcting code ECC1) and, in step S605, a new error correcting code (e.g. the new error correcting code ECC2') is generated according to the error corrected data. Then, in step S607, the data to be written and the new error correcting code are stored in the physical block of the flash memory 402.

If the access command is a read command, in step S609, the read data (e.g. the data DATA1) and the corresponding new error correcting code (e.g. the new error correcting code ECC2') are read from the physical block of the flash memory 102 according to the command.

Next, in step S611, a determination is made on whether the read data contains an error bit according to the new error correcting code. If it is determined in step S611 that the read data does not contain an error bit, then in step S613, a corresponding old error correcting code is re-generated according to the read data and in step S615, the read data and the re-generated old error correcting code are transmitted to the host controller 200.

If it is determined in step S611 that the read data has an error bit, then in step S617, error correction is performed on the error bit and in step S619, it is determined if the error bit has been corrected. If it is determined in step S619 that the error bit has been corrected, then in step S621, a corresponding old error correcting code is re-generated according to the error corrected data and in step S623, an error bit that may be corrected by the host controller 200 is generated from the error corrected data. Next, in step S625, the data containing the error bit and the re-generated old error correcting code are transmitted to the host controller 200.

If it is determined in step S619 that the error bit is not correctable, in step S627, default error data and default error correcting code are transmitted to the host controller 200.

In summary, in the present invention, an error correcting controller capable of supporting a new flash memory is disposed between a host controller of an old system and the new flash memory so as to enable the host controller of the old system to access the new generation flash memory.

It will be apparent to those skilled in the art that various modifications and variations can be made to the structure of the present invention without departing from the scope or spirit of the invention. In view of the foregoing, it is needed that the present invention cover modifications and variations of this invention provided they fall within the scope of the following claims and their equivalents.

What is claimed is:

1. An error correcting controller, comprising:
a first flash memory interface, for connecting a host controller;
a second flash memory interface, for connecting a flash memory;
a micro-processor unit, electrically connected to the first flash memory interface and the second flash memory interface;
an error creation unit, electrically connected to the micro-processor unit; and a first error correcting unit, electrically connected to the micro-processor unit, wherein when the host controller needs to write data into the flash memory, the first error correcting unit generates a first error correcting code and stores the data and the first error correcting code in the flash memory,
wherein when the host controller needs to read the data from the flash memory, the micro-processor unit reads the data and the first error correcting code from the flash memory and the first error correcting unit determines according to the first error correcting code whether the read data contains at least one error bit and whether the at least one error bit is correctable,
when the first error correcting unit determines that the read data has the at least one error bit and the at least one error bit is correctable, the error creation unit generates correctable error data and the micro-processor unit transmits the correctable error data to the host controller,
wherein the correctable error data is generated according to the data that has been error corrected according to the first error correcting code and can be corrected by the host controller,
wherein when the first error correcting unit controller determines that the read data contains the at least one error bit and the at least one error bit is not correctable, then the micro-processor unit transmits default error data to the host controller, and the host controller determines that the default error data contains a plurality of default error bits and the default error bits are not correctable,
wherein when the host controller needs to write the data into the flash memory, the second error correcting unit corrects the data according to the second error correcting code,
wherein the host controller further comprises a third error correcting unit,
wherein the data further comprises a second error correcting code,
further comprising a second error correcting unit electrically connected to the micro-processor unit, wherein the second error correcting unit has a maximum number of error correcting bits equal to the maximum number of error correcting bits of the third error correcting unit.

2. The error correcting controller according to claim 1, wherein the third error correcting unit has a maximum number of error correcting bits smaller than the maximum number of error correcting bits of the first error correcting unit.

3. The error correcting controller according to claim 1, wherein when the host controller needs to read the data from the flash memory, the second error correcting unit generates the second error correcting code according to the error corrected data.

4. The error correcting controller according to claim 1, wherein the micro-processor unit stores parameter information of the first error correcting unit in a physical block of the flash memory and marks the physical block as a damaged block.

5. The error correcting controller according to claim 1, further comprising a data converter, wherein the data converter determines if the data contains continuous bits of same value, and when the data contains continuous bits of same value, the data converter rearranges the data before the data and the first error correcting code are stored into the flash memory.

6. A flash memory chip system, comprising:
a flash memory; and
an error correcting controller, electrically connected to the flash memory, wherein when the host controller needs to write data into the flash memory, the error correcting controller generates a first error correcting code and stores the data and the first error correcting code in the flash memory,
when the host controller needs to read the data from the flash memory, the error correcting controller reads the data and the first error correcting code from the flash memory and determines according to the first error correcting code whether the data contains at least one error bit and whether the at least one error bit is correctable,
when the error correcting controller determines that the read data contains the at least one error bit and the at least one error bit is correctable, then the error correcting controller transmits correctable error data to the host controller,
wherein the correctable error data is generated according to the data that has been error corrected according to the first error correcting code and can be corrected by the host controller,
wherein when the error correcting controller determines that the read data contains the at least one error bit and the at least one error bit is not correctable, then the error correcting controller transmits default error data to the host controller, and the host controller determines that the default error data contains a plurality of default error bits and the default error bits are not correctable,
wherein the data further comprises a second error correcting code,
wherein when the host controller needs to write the data into the flash memory, the error correcting controller corrects the data according to the second error correcting code.

7. The flash memory chip system according to claim 6, wherein when the host controller needs to read the data from the flash memory, the error correcting controller re-generates the second error correcting code according to the data.

8. The flash memory chip system according to claim 6, wherein the error correcting controller stores relevant parameter information in a physical block of the flash memory and marks the physical block as a damaged block.

9. The flash memory chip system according to claim 6, wherein the error correcting controller determines if the data contains continuous bits of same value, and when the data contains continuous bits of same value, the error correcting controller rearranges the data before the data and the first error correcting code are stored into the flash memory.

10. An error correcting method, for correcting data in a flash memory accessed by a host controller, the error correcting method comprising:
when the host controller needs to write data into the flash memory, generating a first error correcting code and storing the data and the first error correcting code in the flash memory; and
when the host controller needs to read the data from the flash memory, reading the data and the first error correcting code from the flash memory and determining according to the first error correcting code whether the data contains at least one error bit and whether the at least one error bit is correctable,
wherein when it is determined that the read data has the at least one error bit and the at least one error bit is correctable, the correctable error data is transmitted to the host controller,
wherein the correctable error data is generated according to the data that has been error corrected according to the first error correcting code and can be corrected by the host controller,
wherein when it is determined that the read data contains the at least one error bit and the at least one error bit is not correctable, then default error data is transmitted to the host controller, and
wherein the host controller determines that the default error data contains a plurality of default error bits and the default error bits are not correctable,
wherein the data further comprises a second error correcting code,
wherein the data is corrected according to the second error correcting code when the host controller needs to write the data into the flash memory, and an error message is responded to the host controller according to a vendor command when the second error correcting code cannot be used to correct the data.

11. The error correcting method according to claim 10, further comprising the host controller correcting the data according to the second error correcting code when the host controller needs to read the data from the flash memory.

12. The error correcting method according to claim 10, further comprising storing parameter information in a physical block of the flash memory and marking the physical block as a damaged block.

13. The error correcting method according to claim 10, further comprising:
determining if the data contains continuous bits of same value; and performing a rearrangement on the data before the data and the first error correcting code are stored into the flash memory if the data contains continuous bits of same value.

* * * * *